(12) United States Patent
Sudo et al.

(10) Patent No.: US 10,890,756 B2
(45) Date of Patent: Jan. 12, 2021

(54) OPTICAL SCANNING DEVICE

(71) Applicants: Yasuyuki Sudo, Tokyo (JP); Takahiro Wakasugi, Tokyo (JP)

(72) Inventors: Yasuyuki Sudo, Tokyo (JP); Takahiro Wakasugi, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 132 days.

(21) Appl. No.: 16/204,087

(22) Filed: Nov. 29, 2018

(65) Prior Publication Data
US 2019/0187460 A1 Jun. 20, 2019

(30) Foreign Application Priority Data
Dec. 14, 2017 (JP) ................. 2017-239924

(51) Int. Cl.
*G02B 26/12* (2006.01)
*H01L 41/047* (2006.01)
*G02B 26/10* (2006.01)
*G02B 26/08* (2006.01)

(52) U.S. Cl.
CPC ....... *G02B 26/123* (2013.01); *G02B 26/0858* (2013.01); *G02B 26/105* (2013.01); *H01L 41/047* (2013.01)

(58) Field of Classification Search
CPC ............... G02B 26/123; G02B 26/105; G02B 26/0858; H01L 41/047; H01L 41/0825; H01L 41/0805; H01L 41/0953
See application file for complete search history.

(56) References Cited

U.S. PATENT DOCUMENTS

| 2010/0079558 | A1 | 4/2010 | Shimada | |
|---|---|---|---|---|
| 2012/0112606 | A1* | 5/2012 | Tang | H01L 41/0953 310/348 |
| 2013/0083378 | A1* | 4/2013 | Tanaka | G02B 26/101 359/199.4 |

FOREIGN PATENT DOCUMENTS

JP     2010-100035     5/2010

* cited by examiner

*Primary Examiner* — Kimberly N. Kakalec
(74) *Attorney, Agent, or Firm* — IPUSA, PLLC

(57) ABSTRACT

An optical scanning device includes: a pair of twist beams arranged on both sides of a mirror along a predetermined axis and configured to swing the mirror around the axis; a pair of connection beams connected to the respective twist beams; a piezoelectric sensor formed on the connection beams and configured to detect a displacement of the connection beams caused by a swing of the mirror around the axis; wherein the piezoelectric sensor includes a lower electrode; a piezoelectric thin film stacked on the lower electrode; and an upper electrode stacked on or above the piezoelectric thin film, wherein a bottom surface and a side surface of the piezoelectric thin film form a tilt angle θ, and wherein the tilt angle is greater than 0° and less than or equal to 50°.

9 Claims, 12 Drawing Sheets

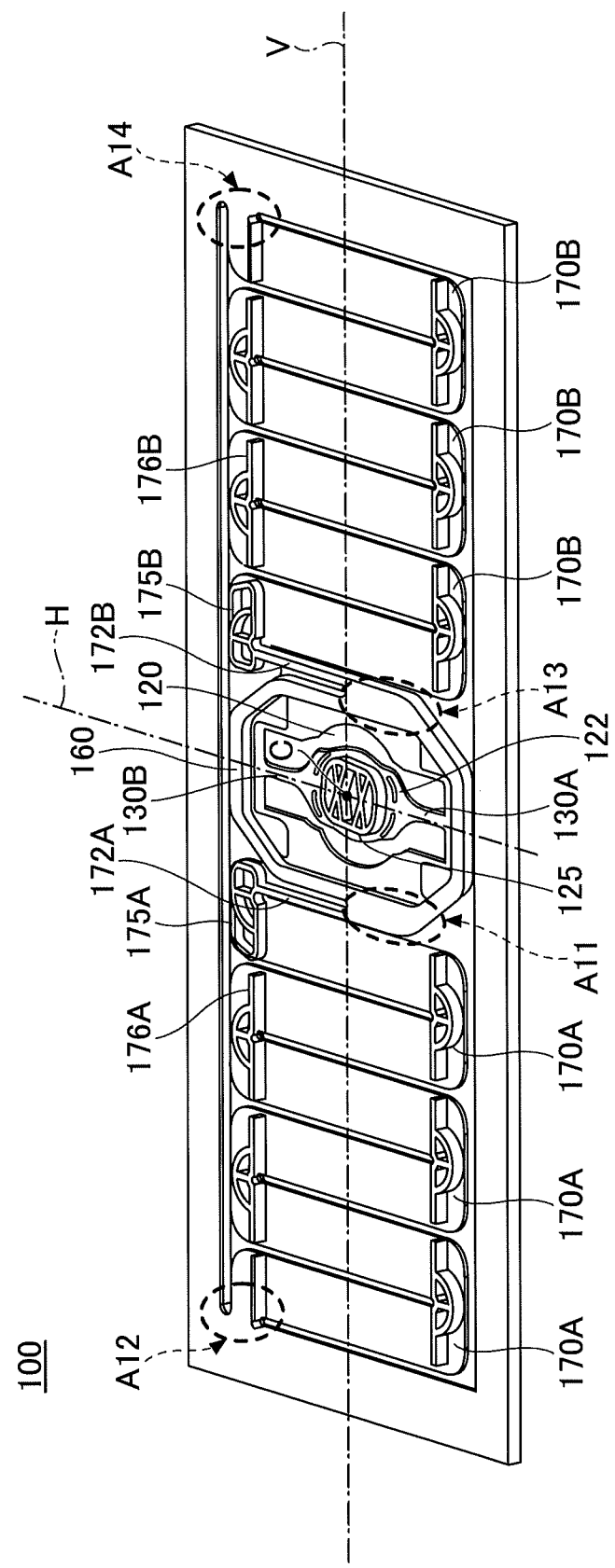

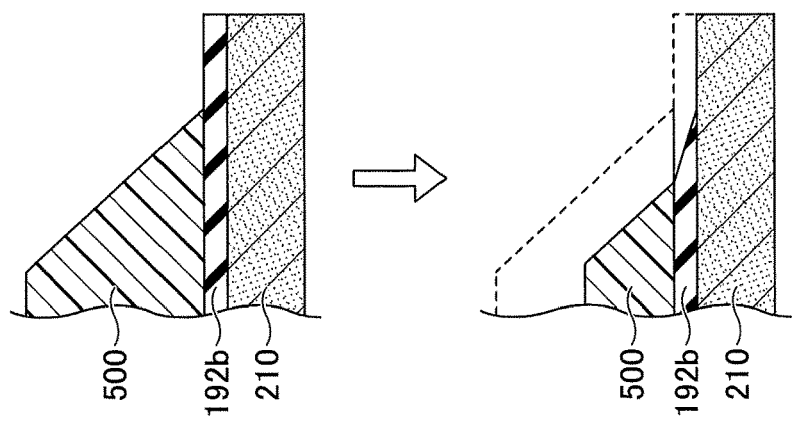
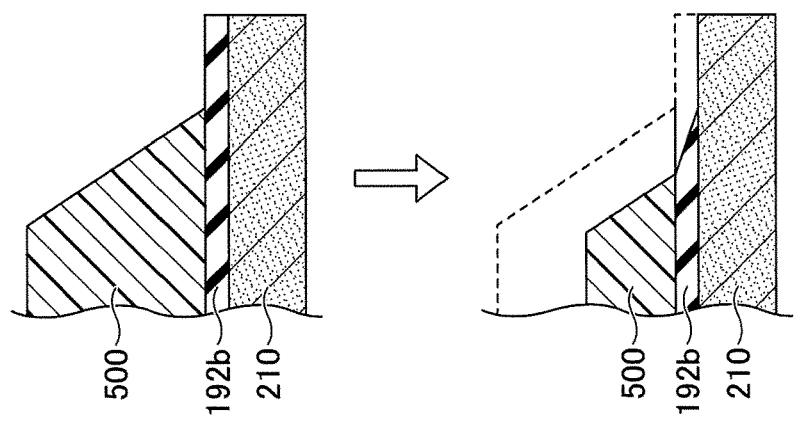
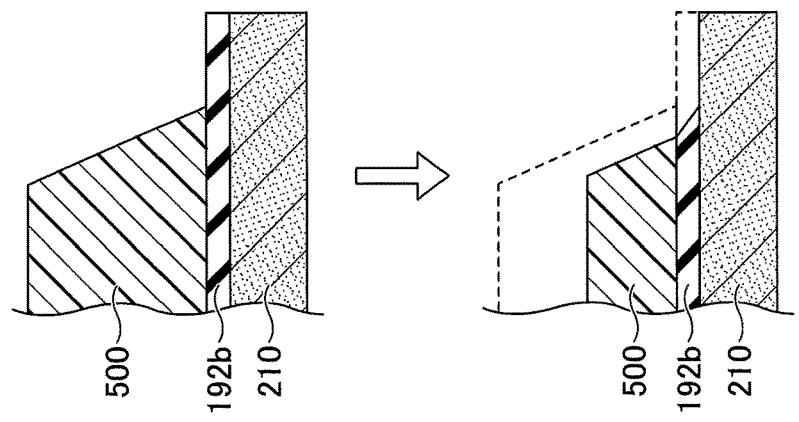
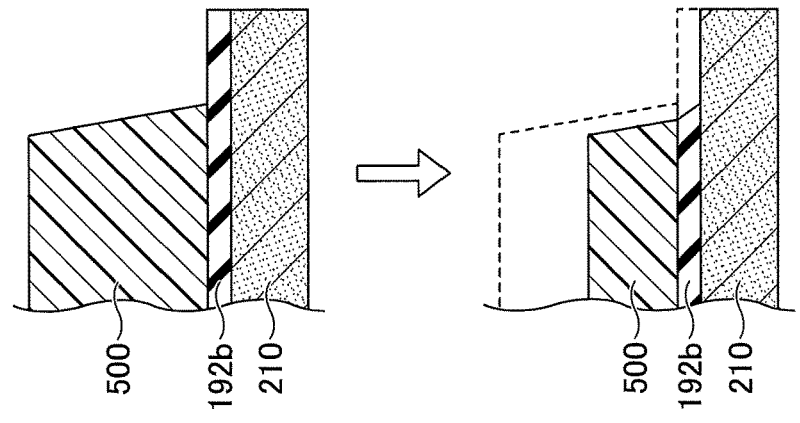

OPTICAL SCANNING DEVICE

CROSS-REFERENCE TO RELATED APPLICATION

The present application is based on and claims priority to Japanese Application No. 2017-239924 filed on Dec. 14, 2017, the entire contents of which are hereby incorporated by reference.

BACKGROUND OF THE INVENTION

1. Field of the Invention

The present invention relates to an optical scanning device.

In a liquid ejecting apparatus or the like that ejects a liquid, a piezoelectric element may be used as a drive source. Also, in an optical scanning device that scans light by rotating a mirror portion, a piezoelectric element may be used as a drive source to drive the mirror portion, and as a piezoelectric sensor that detects a swing angle of the mirror portion, a piezoelectric element having a structure that is the same as the drive source may be used.

A piezoelectric element, which is used as a drive source or a piezoelectric sensor, has a structure in which a piezoelectric thin film made of PZT or the like is stacked on a lower electrode made of metal or the like and further an upper electrode made of a metal or the like is stacked on the piezoelectric thin film, for example.

In such a piezoelectric element, it is proposed to make the side surface of the piezoelectric thin film into a tilted surface in order to relax stress concentration on the piezoelectric thin film and to improve the durability of the piezoelectric thin film (for example, refer to Patent Document 1).

Related-Art Document

Patent Document

[Patent Document 1] Japanese Laid-open Patent Publication No. 2010-100035

Here, in order to obtain an output with a high S/N ratio from a piezoelectric sensor that detects the swing angle of a driven portion, it is preferable that the driven portion driven by the drive source and the piezoelectric sensor are arranged close to a certain degree. However, as the driven portion and the piezoelectric sensor are made closer to each other, stress generated by the driving of the drive source easily concentrates on a piezoelectric thin film constituting the piezoelectric sensor, and the possibility of the piezoelectric sensor being broken increases.

In view of the above, an object of the present invention is to provide an optical scanning device that can relax stress concentration with respect to a piezoelectric sensor even when the distance between a driven portion and a piezoelectric sensor is close.

SUMMARY OF THE INVENTION

An optical scanning device (1000) comprising: a pair of twist beams (130A and 130B) arranged on both sides of a mirror (110) along a predetermined axis (H) and configured to swing the mirror (110) around the axis (H); a pair of connection beams (140A and 140B) connected to the respective twist beams (130A and 130B); a piezoelectric sensor (192) formed on the connection beams (140A and 140B) and configured to detect a displacement of the connection beams (140A and 140B) caused by a swing of the mirror (110) around the axis (H); wherein the piezoelectric sensor (192) includes a lower electrode (192a); a piezoelectric thin film (192b) stacked on the lower electrode (192a); and an upper electrode (192e) stacked on or above the piezoelectric thin film (192b), wherein a bottom surface and a side surface of the piezoelectric thin film (192b) form a tilt angle θ, and wherein the tilt angle is greater than 0° and less than or equal to 50°.

Note that the reference numerals in the above-described parentheses are attached to facilitate understanding; these are merely examples, and the depicted aspects are not limiting.

Advantageous Effects of Invention

According to an embodiment of the present invention, it is possible to provide an optical scanning device that can relax stress concentration with respect to a piezoelectric sensor even when the distance between a driven portion and a piezoelectric sensor is close.

BRIEF DESCRIPTION OF THE DRAWINGS

FIG. 6 is a lower surface side perspective view illustrating another example of the optical scanning unit of the optical scanning device according to the first embodiment;

FIGS. 8A to 8D are diagrams that describe a method of making the side surface of the piezoelectric thin film into a tilted surface;

DETAILED DESCRIPTION OF THE EMBODIMENTS

In the following, an embodiment of the present invention will be described with reference to the drawings. Through-

First Embodiment

Figure 1:
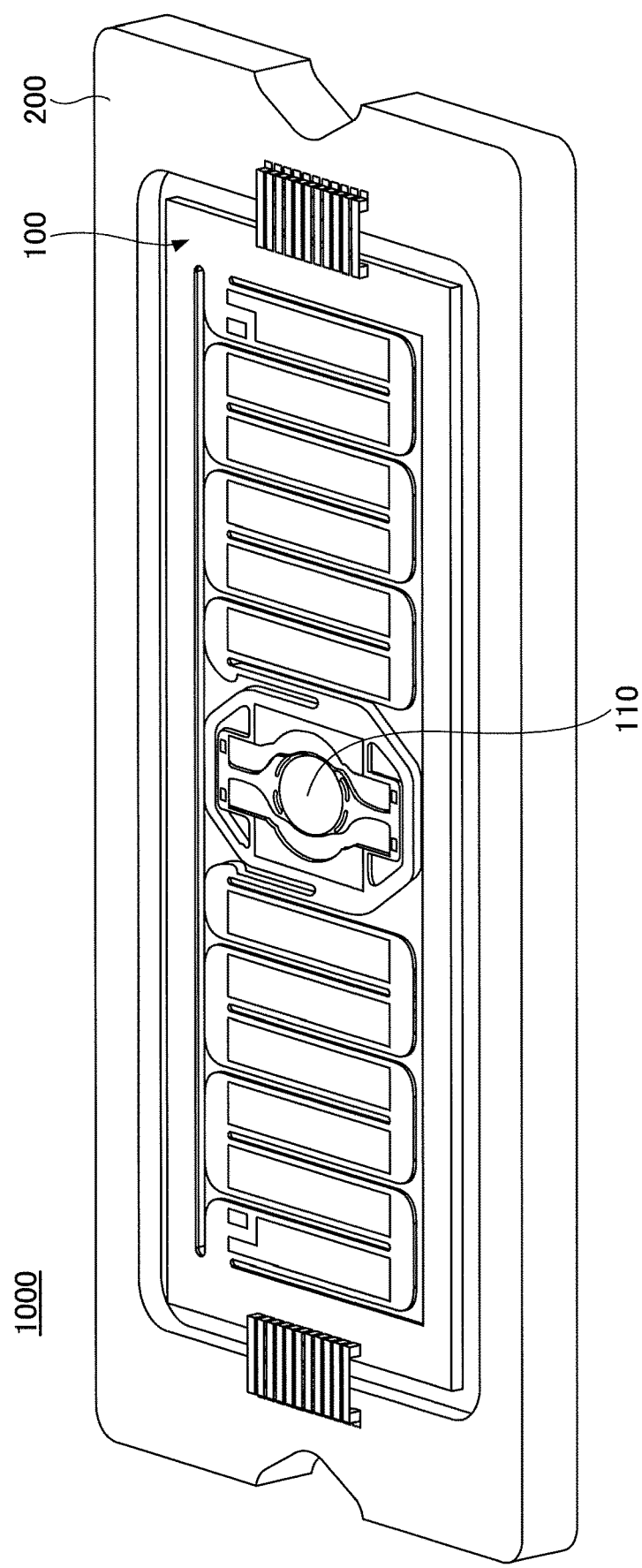
FIG. 1 is a perspective view (1) illustrating an example of an optical scanning device according to a first embodiment.
Figure 2:
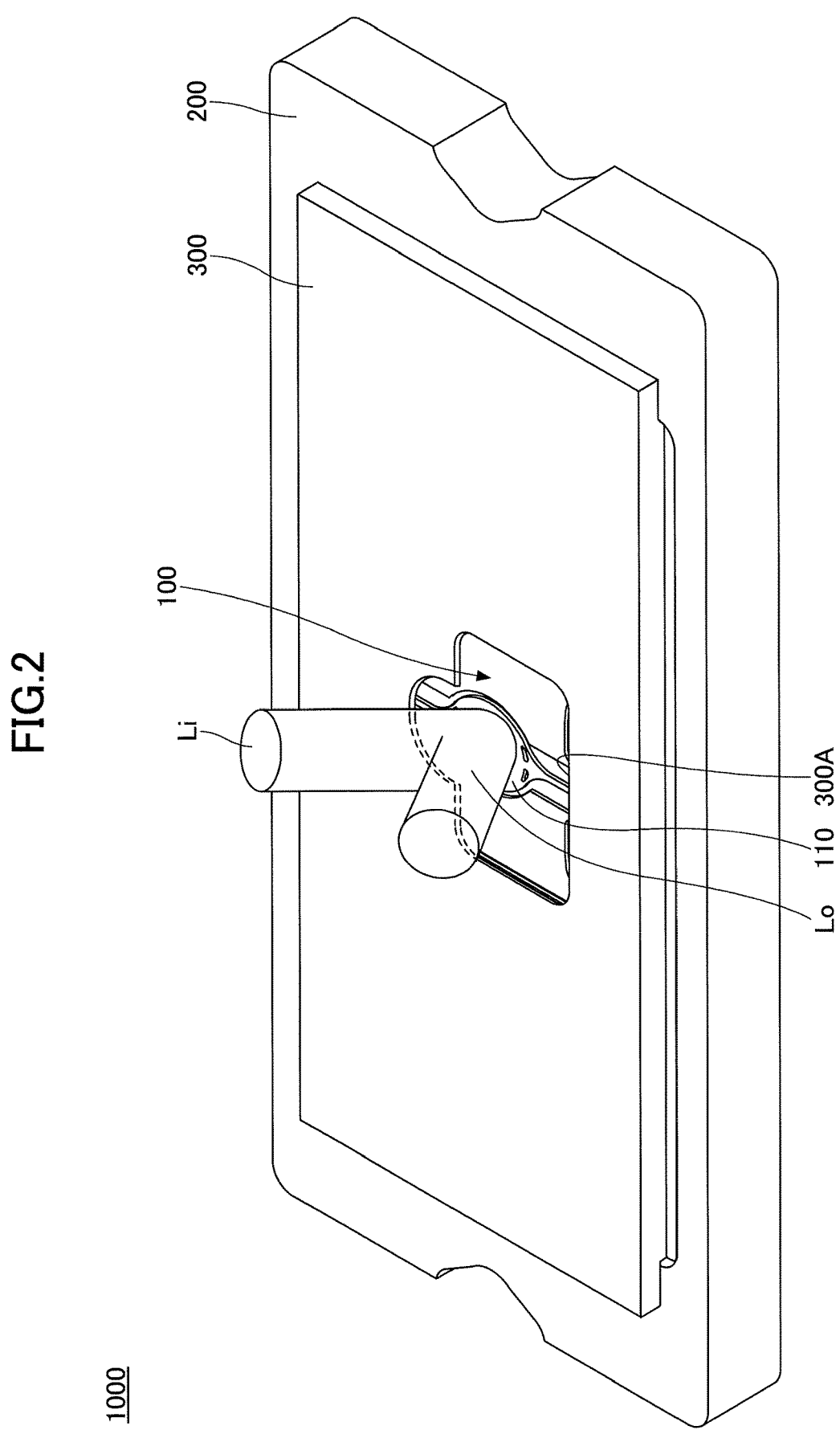
FIG. 2 is a perspective view (2) illustrating an example of the optical scanning device according to the first embodiment.

First, an optical scanning device 1000 according to a first embodiment will be described. FIG. and FIG. 2 are perspective views illustrating an example of the optical scanning device 1000 according to the first embodiment. FIG. 1 illustrates the optical scanning device 1000 in a state in which a package cover 300 is detached. FIG. 2 illustrates the optical scanning device 1000 in a state in which the package cover 300 is attached.

As illustrated in FIG. 1 and FIG. 2, the optical scanning device 1000 includes an optical scanning unit 100, a ceramic package 200 on which the optical scanning unit 100 is mounted, and the package cover 300 that is arranged on the ceramic package 200 and that covers the optical scanning unit 100. The optical scanning device 1000 may include a substrate, a control circuit, etc., on a lower side of the ceramic package 200.

In the optical scanning device 1000, at substantially the center part of the package cover 300, an opening 300A is provided from which the vicinity of a mirror 110 that has an optical reflection surface is exposed. It is assumed that the opening 300A has a shape such that incident laser light Li that is incident onto the mirror 110 and outgoing laser light Lo (scanning light) are not blocked.

It should be noted that, in the opening 300A, the side, through which the incident laser light Li passes, has a smaller opening than that of the side through, which the outgoing laser light Lo passes. In other words, the incident laser light Li side of the opening 300A has a smaller opening with a substantially semicircular shape, and the outgoing laser light Lo side of the opening 300A has a larger opening with a substantially rectangle shape. This is because the incident laser light Li enters from a fixed direction, and thus, the opening should be provided only for the fixed direction. On the other hand, the outgoing laser light Lo is scanned in two dimensions, and thus, the opening is required to be provided for the entire range to be scanned so that the outgoing laser light Lo, which is scanned in two dimensions, is not blocked.

Figure 3:
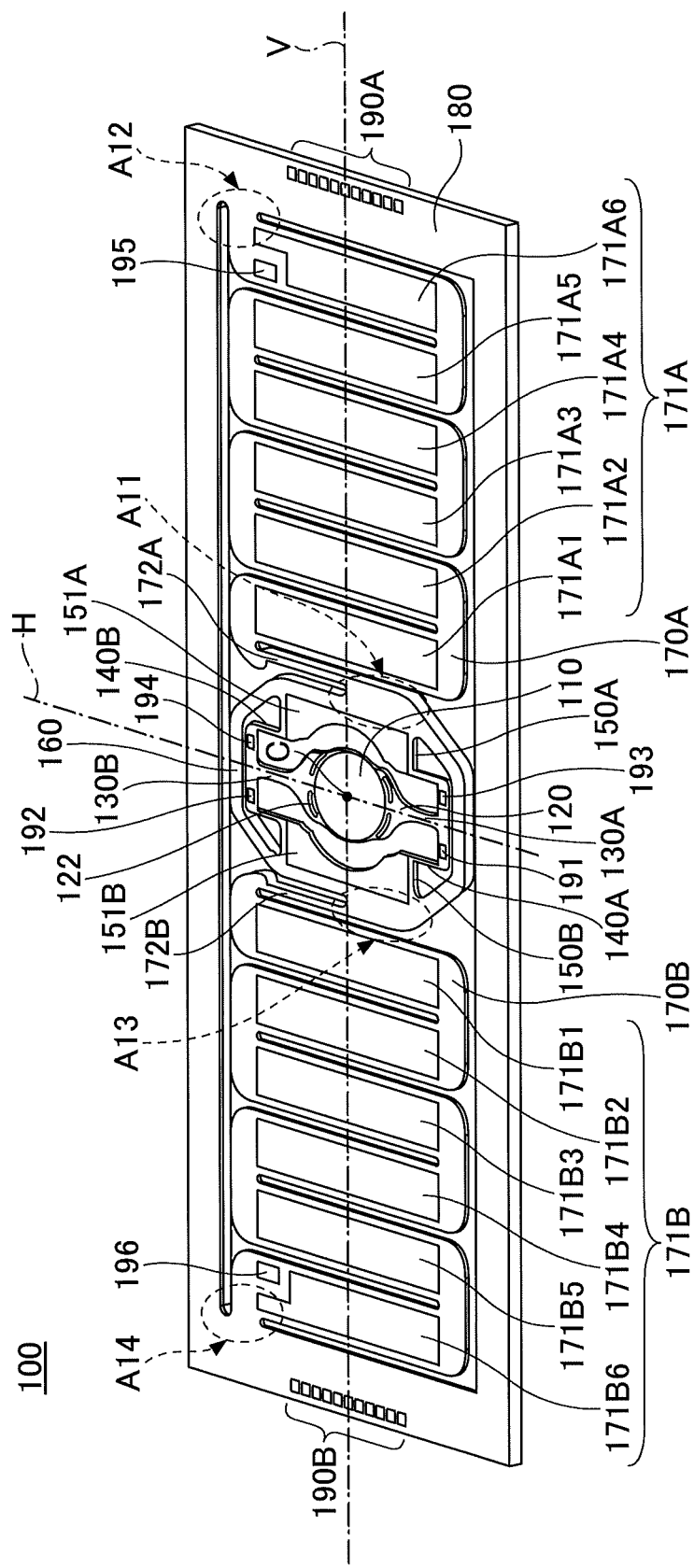
FIG. 3 is an upper surface side perspective view illustrating an example of an optical scanning unit of the optical scanning device according to the first embodiment.

Next, the optical scanning unit 100 of the optical scanning device 1000 will be described. FIG. 3 is an upper surface side perspective view illustrating an example of the optical scanning unit 100 of the optical scanning device 1000 according to the first embodiment.

As illustrated in FIG. 3, the optical scanning unit 100 is a portion that scans laser light emitted from a light source by swinging the mirror 110. The optical scanning unit 100 may be, for example, a MEMS (Micro Electro Mechanical Systems) mirror that drives the mirror 110 by using a piezoelectric element.

The optical scanning unit 100 includes a mirror 110 that has an optical reflection surface, a movable frame 160 that supports the mirror 110 from outside, and a pair of drive beams 170A and 170B that support the movable frame 160 from both sides.

A movable frame connection part A11 is a portion via which the movable frame 160 and the second drive beam 170A are connected. Also, a fixed frame connection part A12 is a portion via which the fixed frame 180 and the second drive beam 170A are connected. The movable frame connection part A11 is arranged on a substantially opposite side to a side on which the fixed frame connection part A12 is arranged, with respect to an axis that passes through the center C of the optical reflection surface of the mirror 110 (hereinafter, referred to as "vertical rotational axis V").

Further, a movable frame connection part A13 is a portion via which the movable frame 160 and the second drive beam 170B are connected. Also, a fixed frame connection part A14 is a portion via which the fixed frame 180 and the second drive beam 170B are connected. The movable frame connection part A13 is arranged on a substantially opposite side to a side on which the fixed frame connection part A14 is arranged, with respect to the vertical rotational axis V.

Also, the movable frame connection parts A11 and A13 may be arranged on a side opposite to a side, on which the fixed frame connection parts A12 and A14 are arranged, with respect to the vertical rotational axis V in such a way that end portions of the movable frame connection parts A11 and A13 include the vertical rotational axis V. Also, the second drive beam 170A and the second drive beam 170B are arranged so as to have line symmetry with respect to an axis of symmetry that passes through the center C of the optical reflection surface of the mirror 110 and that is orthogonal to the vertical rotational axis V (hereinafter, referred to as "horizontal rotational axis H"). The detail will be described in the following.

The optical scanning unit 100 includes the mirror 110, a mirror support unit 120, twist beams 130A and 130B, connection beams 140A and 140B, first drive beams 150A and 150B, the movable frame 160, the second drive beams 170A and 170B, and the fixed frame 180. Further, the first drive beams 150A and 150B include drive sources 151A and 151B, respectively. Further, the second drive beams 170A and 170B include drive sources 171A and 171B, respectively. The first drive beams 150A and 150B and the second drive beams 170A and 170B function as actuators that swing the mirror 110 in an up-and-down direction (vertical direction) and in a left-and-right direction (horizontal direction) to scan laser light.

In the mirror support unit 120, slits 122 are formed along the circumference of the mirror 110. According to the slits 122, not only the weight of the mirror support unit 120 can be reduced, but also the twisting caused by the twist beams 130A and 130B can be transmitted to the mirror 110.

In the optical scanning unit 100, the mirror 110 is supported by the upper surface of the mirror support unit 120, and the mirror support unit 120 is connected to end portions of the twist beams 130A and 130B that are disposed on both sides of the mirror support unit 120. The twist beams 130A and 130B composes a swing axis. The twist beams 130A and 130B extend in the axial direction and support the mirror support unit 120 from both sides in the axial direction. When the twist beams 130A and 130B are twisted, the mirror 110, which is supported by the mirror support unit 120, swings to scan reflected light of light, emitted to the mirror 110. The opposite side end portions, with respect to the mirror support unit 120, of the twist beams 130A and 130B are connected to, and supported by the connection beams 140A and 140B, and connected to the first drive beams 150A and 150B, respectively. In other words, the connection beams 140A and 140B have portions connected to end portions on opposite sides of the mirror support unit 120 of the respective twist beams 130A and 130B and extending in a direction perpendicular to the axis H.

The first drive beams 150A and 150B, the connection beams 140A and 140B, the twist beams 130A and 130B, the mirror support unit 120, and the mirror 110 are supported by the movable frame 160 from outside. One side of the first drive beam 150A and one side of the first drive beam 150B are supported by the movable frame 160. The other side of the first drive beam 150A extends to the inner circumference side and is connected to the connection beams 140A and 140B. Similarly, the other side of the first drive beam 150B extends to the inner circumference side and is connected to the connection beams 140A and 140B.

The first drive beams 150A and 150B are provided as a pair in a direction orthogonal to the twist beams 130A and 130B in such a way that the mirror 110 and the mirror support unit 120 are sandwiched by the first drive beams 150A and 150B. The drive sources 151A and 151B are formed on the upper surfaces of the first drive beams 150A and 150B, respectively. The drive sources 151A and 151B include upper electrodes formed on thin films of piezoelectric elements (hereinafter, referred to as "piezoelectric thin films") on the upper surfaces of the first drive beams 150A and 150B, and lower electrodes formed on the lower surfaces of the piezoelectric thin films. The drive sources 151A and 151B expand and contract according to the polarity of the drive voltage applied to the upper electrodes and the lower electrodes.

Therefore, by alternately applying drive voltages that have phases different from each other to the first drive beam 150A and the first drive beam 150B, the first drive beam 150A and the first drive beam 150B, disposed on the left side and the right side of the mirror 110, alternately oscillate in opposite vertical directions. According to this operation, it is possible to swing (rotate) the mirror 110 around the twist beams 130A and 130B as a swing axis or a rotational axis. Hereinafter, the direction, in which the mirror 110 swings around the twist beams 130A and 130B as an axis, is referred to as a horizontal direction. Resonance vibration, for example, can be used for the horizontal drive by the first drive beams 150A and 150B such that the mirror 110 can be driven to swing at high speed.

Further, one end of the second drive beam 170A and one end of the second drive beam 170B are connected to the outside of the movable frame 160 at the movable frame connection parts A11 and A13 via the connection beams 172A and 172B, respectively. The second drive beams 170A and 170B are provided as a pair in such a way that the movable frame 160 is sandwiched from left side and right side by the second drive beams 170A and 170B. Further, the second drive beams 170A and 170B support the movable frame 160 from both sides, and swings the movable frame 160 around the vertical rotational axis V.

The second drive beam 170A has a zigzag shape as a whole by having each of a plural number (e.g., even number) of rectangle beams, which are disposed in parallel with the first drive beam 150A, connected to an adjacent rectangle beam at the end. Further, the other end of the second drive beam 170A is connected to the inside of the fixed frame 180 at the fixed frame connection part A12.

Similarly, the second drive beam 170B has a zigzag shape as a whole by having each of a plural number (e.g., even number) of rectangle beams, which are disposed in parallel with the first drive beam 150B, connected to an adjacent rectangle beam at the end. Further, the other end of the second drive beam 170B is connected to the inside of the fixed frame 180 at the fixed frame connection part A14.

As described above, in the optical scanning unit 100, the movable frame connection part A11, at which the movable frame 160 and the second drive beam 170A are connected, is arranged on a side substantially opposite to a side on which the fixed frame connection part A12, at which the fixed frame 180 and the second drive beam 170A are connected, is arranged, with respect to the vertical rotational axis V.

Further, in the optical scanning unit 100, the movable frame connection part A13, at which the movable frame 160 and the second drive beam 170B are connected, is arranged on a side substantially opposite to a side on which the fixed frame connection part A14, at which the fixed frame 180 and the second drive beam 170B are connected, is arranged, with respect to the vertical rotational axis V.

Also, the movable frame connection parts A11 and A13 may be arranged on a side opposite to a side on which the fixed frame connection parts A12 and A14 are arranged, with respect to the vertical rotational axis V in such a way that end portions of the movable frame connection parts A11 and A13 include the vertical rotational axis V. Furthermore, the second drive beam 170A and the second drive beam 170B are arranged in a line symmetric relationship that has the horizontal rotational axis H as a symmetry axis.

On the upper surfaces of the second drive beams 170A and 170B, the drive sources 171A and 171B are formed for respective rectangle units that do not include curved portions. The drive source 171A includes an upper electrode, formed on the piezoelectric thin film on the upper surface of the second drive beam 170A, and a lower electrode, formed on the lower surface of the piezoelectric thin film. The drive source 171B includes an upper electrode, formed on the piezoelectric thin film on the upper surface of the second drive beam 170B, and a lower electrode, formed on the lower surface of the piezoelectric thin film.

By applying drive voltages that have polarities different from each other to adjacent rectangle units of the drive sources 171A and 171B, the second drive beams 170A and 170B cause adjacent rectangle beams to warp vertically in directions opposite to each other, and transmit accumulated vertical movements of the rectangle beams to the movable frame 160. This operation of the second drive beams 170A and 170B swings the mirror 110 in a vertical direction that is orthogonal to the parallel direction. For example, non-resonant vibration can be used for the vertical drive by the second drive beams 170A and 170B.

For example, it is assumed that the drive source 171A includes drive sources 171A1, 171A2, 171A3, 171A4, 171A5, and 171A6 that are disposed sequentially from the movable frame 160 side toward the right side. Further, it is assumed that the drive source 171B includes drive sources 171B1, 171B2, 171B3, 171B4, 171B5, and 171B6 that are disposed sequentially from the movable frame 160 side toward the left side. In this case, by driving the drive sources 171A1, 171B1, 171A3, 171B3, 171A5, and 171B5 with a first same waveform voltage, and by driving the drive sources 171A2, 171B2, 171A4, 171B4, 171A6, and 171B6 with a second same waveform voltage different from the first same waveform voltage, it is possible to swing the mirror 110 in the vertical direction.

Drive wires used for applying drive voltages to the upper electrode and the lower electrode of the drive source 151A are connected to predetermined terminals included in a group of terminals 190A disposed on the fixed frame 180. Further, drive wires used for applying drive voltages to the upper electrode and the lower electrode of the drive source 151B are connected to predetermined terminals included in a group of terminals 190B disposed on the fixed frame 180. Further, drive wires used for applying upper electrodes and lower electrodes of the drive source 171A are connected to predetermined terminals included in the group of terminals 190A disposed on the fixed frame 180. Further, drive wires used for applying upper electrodes and lower electrodes of the drive source 171B are connected to predetermined terminals included in the group of terminals 190B disposed on the fixed frame 180.

Further, the optical scanning unit 100 includes, as a horizontal swing angle sensor, a piezoelectric sensor 192 that detects a tilt degree in the horizontal direction (swing angle in the horizontal direction) of the mirror 110 in a state in which drive voltages are applied to the drive sources 151A and 151B and the mirror 110 swings in the horizontal direction. The piezoelectric sensor 192 is provided on the connect beam 140B. The piezoelectric sensor 192 can be disposed, for example, at a portion of the connection beam 140B extending in the direction perpendicular to the horizontal rotational axis H.

Further, the optical scanning unit 100 includes piezoelectric elements 191 and 193 on the connection beam 140A and includes a piezoelectric element 194 on the connection beam 140B. They are formed in a structure similar to that of the piezoelectric sensor 192 in order to make the weight balance between the connect beam 140A and the connect beam 140B uniform, and are disposed at positions line-symmetrical each of to the horizontal rotational axis H and the vertical rotational axis V. It should be noted that by forming wires on the piezoelectric elements 191, 193, and 194, they may be used as a horizontal swing angle sensor that detects a swing angle in the horizontal direction similarly to the piezoelectric sensor 192.

Further, the optical scanning unit 100 includes piezoelectric sensors 195 and 196 as vertical swing angle sensors that detect a tilted degree of the mirror 110 in the vertical direction (swing angle in the vertical direction) in a state where drive voltages are applied to the drive sources 171A and 171B to swing the mirror 110 in the vertical direction. The piezoelectric sensor 195 is disposed on one of the rectangle beams included in the second drive beam 170A and the piezoelectric sensor 196 is disposed on one of the rectangle beams included in the second drive beam 170B.

The piezoelectric sensor 192 outputs a current value corresponding to a displacement of the connection beam 140B transmitted from the twist beam 130B according to a tilt degree of the mirror 110 in the horizontal direction. The piezoelectric sensor 195 outputs a current value corresponding to a displacement of the rectangle beam of the second drive beam 170A on which the piezoelectric sensor 195 is disposed, according to a tilt degree of the mirror 110 in the vertical direction. The piezoelectric sensor 196 outputs a current value corresponding to a displacement of the rectangle beam of the second drive beam 170B on which the piezoelectric sensor 196 is disposed, according to a tilt degree of the mirror 110 in the vertical direction.

In the first embodiment, a tilt degree of the mirror 110 in the horizontal direction is detected by using outputs of the piezoelectric sensor 192, and a tilt degree of the mirror 110 in the vertical direction is detected by using outputs of the piezoelectric sensors 195 and 196. It should be noted that a tilt degree detection unit that detects a tilt degree of the mirror 110 according to the current values output from the respective piezoelectric sensors may be provided outside the optical scanning unit 100. Also, a drive control unit that controls drive voltages supplied to the drive sources 151A and 151B and the drive sources 171A and 171B based on a detection result of the tilt degree detection unit may be provided outside the optical scanning unit 100.

The piezoelectric sensors 192, 195 and 196 include upper electrodes formed on upper surfaces of piezoelectric thin films and include lower electrodes formed on lower surfaces of the piezoelectric thin films. In the first embodiment, outputs from the respective piezoelectric sensors are current values of the sensor wires connected to the upper electrodes and the lower electrodes.

Sensor wires drawn out from the upper electrode and the lower electrode of the piezoelectric sensor 192 are connected to predetermined terminals included in the group of terminals 190B disposed on the fixed frame 180. Further, sensor wires drawn out from the upper electrode and the lower electrode of the piezoelectric sensor 195 are connected to predetermined terminals included in the group of terminals 190A disposed on the fixed frame 180. Further, sensor wires drawn out from the upper electrode and the lower electrode of the piezoelectric sensor 196 are connected to predetermined terminals included in the group of terminals 190B disposed on the fixed frame 180.

Figure 4:
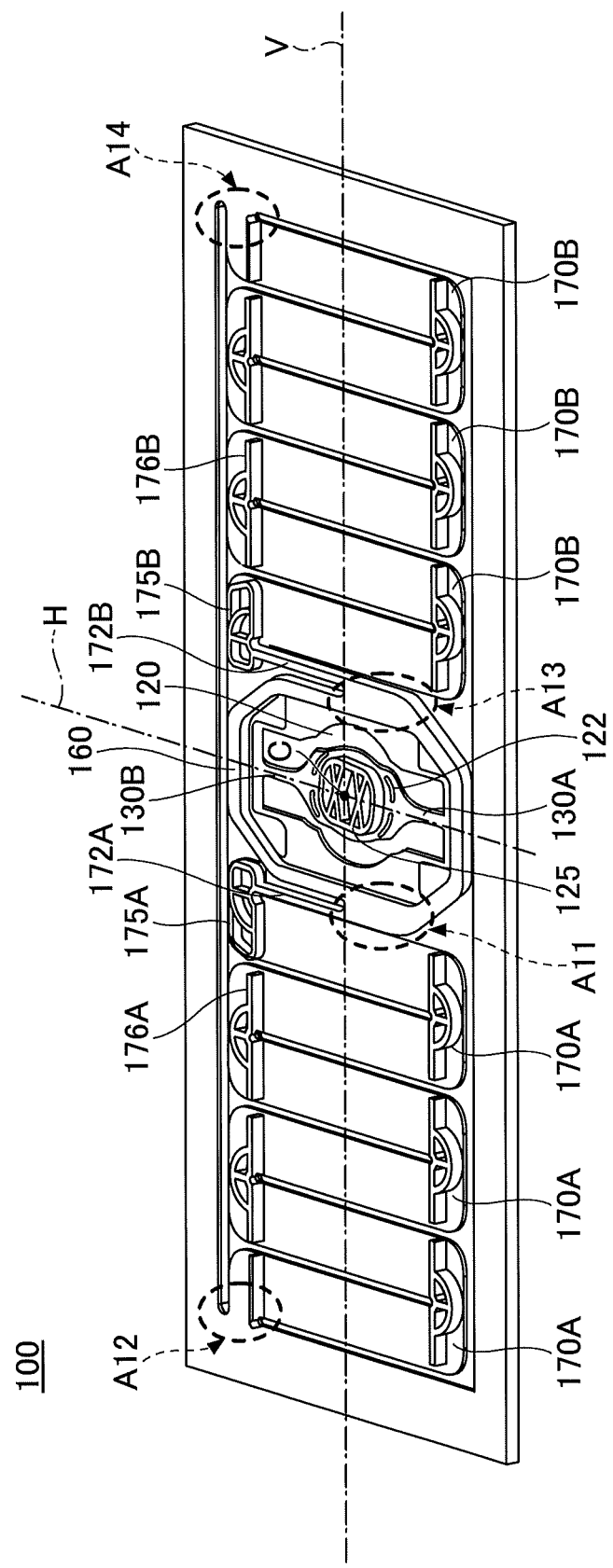
FIG. 4 is a lower surface side perspective view illustrating an example of the optical scanning unit of the optical scanning device according to the first embodiment.

FIG. 4 is a lower surface side perspective view illustrating an example of the optical scanning unit 100 of the optical scanning device 1000 according to the first embodiment.

As illustrated in FIG. 4, a rib 125 is provided on the lower surface of the mirror support unit 120. By providing the rib 125, it is possible to reduce occurrences of distortion of the mirror 110 and to keep the mirror 110 flat when driving the mirror 110. The rib 125 is formed in such a way that the outline of the rib 125 substantially matches the shape of the mirror 110. With this arrangement, it is possible to keep the entire mirror 110 flat. Further, by providing the slits 122 formed in the mirror support unit 120, it is possible to distribute a stress transmitted from the twist beams 130A and 130B in the mirror support unit 120, and to prevent the stress from being transmitted to the rib 125.

In the lower surfaces of the second drive beams 170A and 170B, ribs 175A and 175B are provided at connection portions that are connected to the connection beams 172A and 172B. By providing the ribs 175A and 175B, the portions, at which the second drive beams 170A and 170B and the connection beams 172A, 172B are connected, can be reinforced, and the rigidity can be increased to prevent a deformation.

Further, in the lower surfaces of the second drive beams 170A and 170B, ribs 176A and 176B are provided at connection portions at which the adjacent drive beams are connected to each other. By providing the ribs 176A and 176B, the portions, at which the adjacent drive beams are connected to each other, can be reinforced, and the rigidity can be increased to prevent a deformation.

Figure 5:
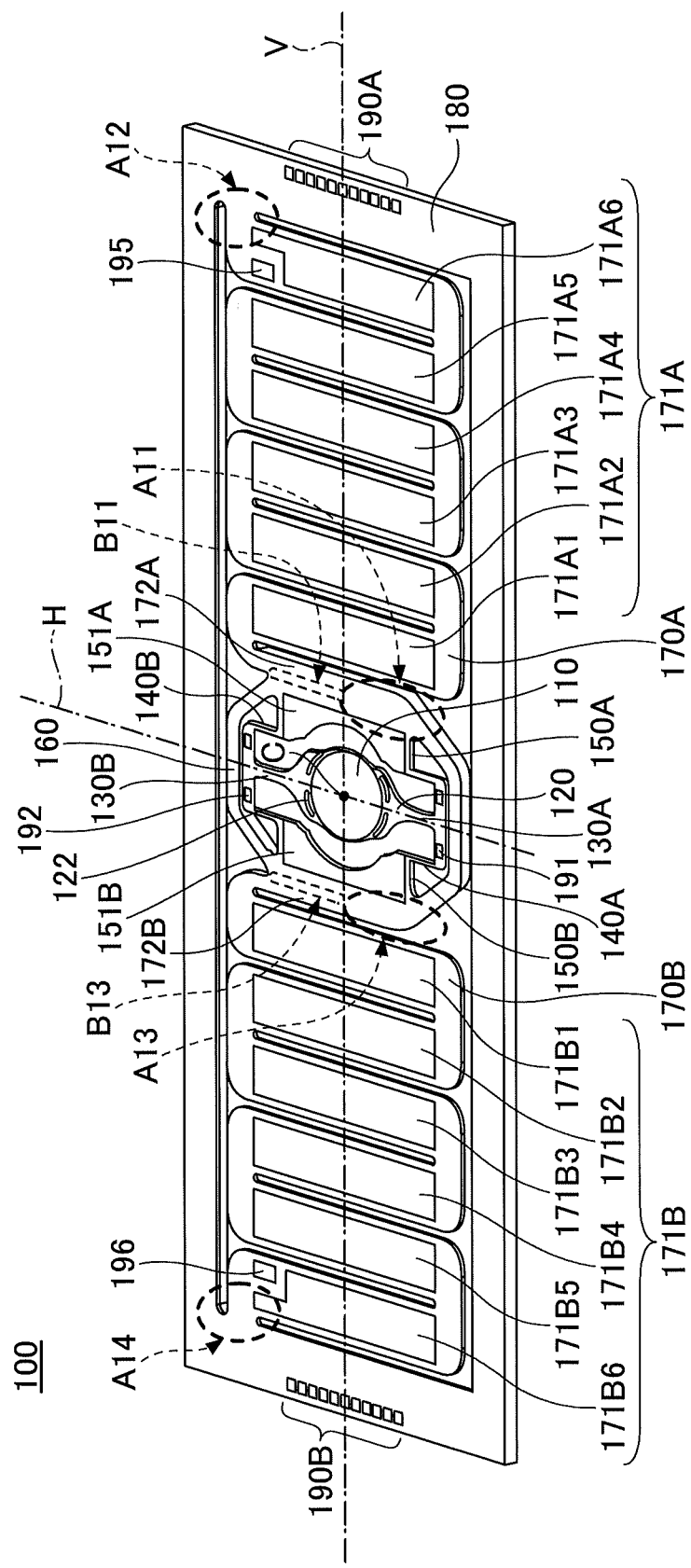
FIG. 5 is an upper surface side perspective view illustrating another example of an optical scanning unit of an optical scanning device according to the first embodiment.

FIG. 5 is an upper surface side perspective view illustrating another example of the optical scanning unit 100 of the optical scanning device 1000 according to the first embodiment. FIG. 6 is a lower surface side perspective view illustrating another example of the optical scanning unit 100 of the optical scanning device 1000 according to the first embodiment.

The optical scanning unit 100 can be formed by using, for example, a SOI (Silicon On Insulator) substrate that has a support layer, a buried oxide (BOX) layer, and an active layer. In this case, as illustrated in FIG. 5 and FIG. 6, the connection beams 172A and 172B and the movable frame 160 may be connected via the active layer and the BOX layer. It should be noted that, in FIG. 5, a portion, in which the connection beam 172A and the movable frame 160 are connected via the active layer and the BOX layer, is indicated by a dashed line area B11, and a portion, in which the connection beam 172B and the movable frame 160 are connected via the active layer and the BOX layer, is indicated by a dashed line area B13. Also, the connection beams 172A and 172B and the movable frame 160 may be connected via the active layer alone.

Figure 7A:
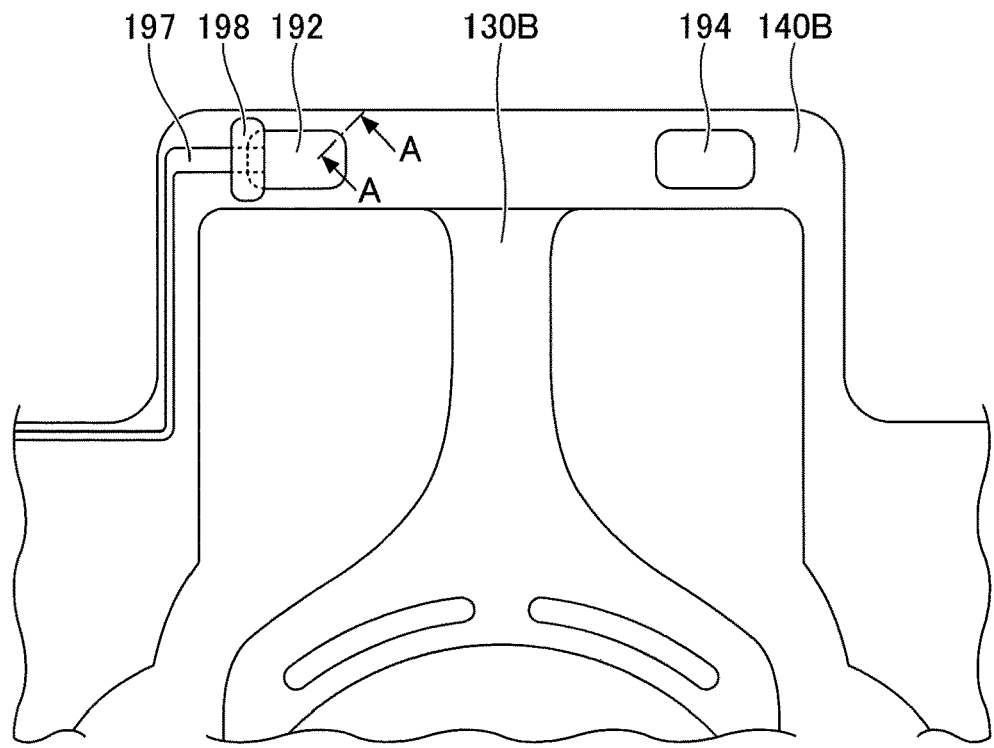
FIGS. 7A and 7B are diagrams that describe a piezoelectric sensor.
Figure 7B:
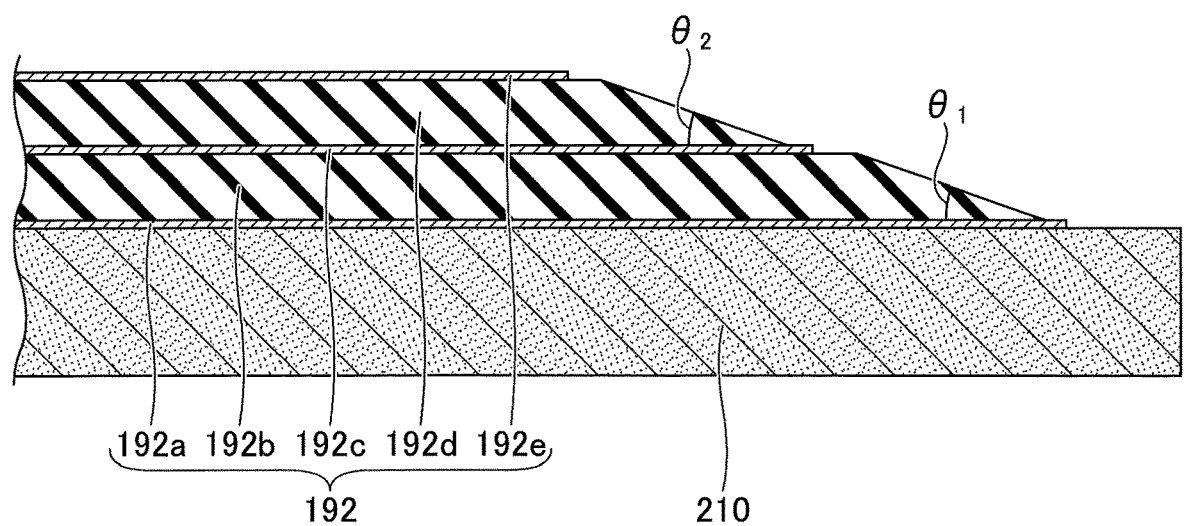

FIGS. 7A and 7B are diagrams that describe the piezoelectric sensor 192. FIG. 7A is a partial plan view, and FIG. 7B is a cross-sectional view taken along the line A-A in FIG. 7A.

As illustrated in FIG. 7B, the piezoelectric sensor 192 is formed on a silicon substrate 210, and can be structured such that a lower electrode 192a, a piezoelectric thin film 192b, an intermediate electrode 192c, a piezoelectric thin film 192d, and an upper electrode 192e are sequentially stacked. The upper electrode 192e of the piezoelectric sensor 192 is electrically connected to a wire 197, and a part of the upper electrode 192e and the wire 197 is covered with an insulating film 198.

However, the structure of the piezoelectric sensor 192 is not limited to the example that is illustrated in FIGS. 7A and 7B. For example, in the piezoelectric sensor 192, at least one layer of piezoelectric thin film may be used. In this case, the piezoelectric sensor 192 has a three-layer structure in which a lower electrode is formed below the piezoelectric thin film and an upper electrode is formed above the piezoelectric thin film and an intermediate electrode is unnecessary. Also, three or more layers of piezoelectric thin films may be provided. In this case, a required number of piezoelectric thin films and intermediate electrodes are alternately stacked on a lower electrode, and finally a piezoelectric thin film and an upper electrode are sequentially stacked on the uppermost intermediate layer.

For example, PZT (lead zirconate titanate), BaTiO$_3$ (barium titanate), or the like can be used as a material of the piezoelectric thin films 192b and 192d. As a material of the lower electrode 192a and the upper electrode 192e, for example, Pt (platinum) or the like can be used.

Each of the piezoelectric sensors 195 and 196 can have a stacking structure similar to that of the piezoelectric sensor 192. Also, each of the drive sources 151A, 151B, 171A, and 171B can have a stacking structure similar to that of the piezoelectric sensor 192. In the drive sources 151A, 151B, 171A, and 171B, by making piezoelectric thin films in n layers, the voltage for making the mirror 110 at a same swing angle can be 1/n of that in the case of one layer.

The side surface of the piezoelectric thin film 192b is a tiled surface, and the tilt angle $\theta_1$ of the side surface with respect to the bottom surface of the piezoelectric thin film 192b can be, for example, less than or equal to approximately 50 degrees. Similarly, the side surface of the piezoelectric thin film 192d is a tiled surface, and the tilt angle $\theta_2$ of the side surface with respect to the bottom surface of the piezoelectric thin film 192d can be, for example, less than or equal to approximately 50 degrees. The tilt angle $\theta_1$ and the tilt angle $\theta_2$ may be a same angle.

Note that in the present application, a tilt angle of a side surface with respect to a bottom surface of a piezoelectric thin film means, when an electrode formed for the base of the piezoelectric thin film is defined as a bottom side and a line connecting the point where the piezoelectric thin film begins to tilt (at the opposite side of the electrode) and the point where the piezoelectric thin film is in contact with the electrode is defined as an oblique side, an angle formed by the bottom edge and the oblique edge. Here, an electrode formed for the base of a piezoelectric thin film is, for example, an electrode such as the lower electrode 192a and the intermediate electrode 192c that are illustrated in FIG. 7B.

In order to form make side surface of a piezoelectric thin film into a tilted surface, first, as illustrated above the arrows in FIGS. 8A to 8D, the piezoelectric thin film 192b (which is, for example, a PZT film) is formed on the entire surface of the silicon substrate 210 via the lower electrode 192a (not illustrated here). Further, a resist material to be a resist 500 is formed on the entire surface of the piezoelectric thin film 192b (PZT film). Then, after the resist material is heated (baked), it is exposed and developed to obtain the resist 500 having a predetermined shape.

In each of FIGS. 8A to 8D, the tilt angle of the side surface of the resist 500 covering the piezoelectric thin film 192b differs. Specifically, in the order from FIG. 8A to FIG. 8D, the tilt angle of the side surface of the resist 500 decreases. The tilt angle of the side surface of the resist 500 can be controlled by changing the resist material, the heating temperature, the exposure amount, and the like.

Next, as below each of FIGS. 8A to 8D, for example, the PZT film exposed from the resist 500 is dry-etched by using a dry etching apparatus such as an ICP-RIE apparatus. At this time, due to the selectivity of the etching rate between the PZT film and the resist 500, it possible to form a PZT film (piezoelectric thin film 192b) whose side surface is a tilted surface. For example, it is possible to use a dry etching apparatus such that the selection ratio of the PZT film to the resist 500 is 1:3.

However, the selectivity of the etching rate between the PZT film and the resist 500 can also be adjusted by gas used for dry etching. For example, in a case in which a mixed gas of $SF_6$ (sulfur hexafluoride) and $C_4F_8$ (octafluorocyclobutane) is used for dry etching, by changing the mixing ratio of $SF_6$ and $C_4F_8$, the selectivity of the etching rate between the PZT film and the resist 500 can be adjusted.

Alternatively, by changing the "degree of vacuum", "Bias power", etc., which are parameters of a dry etching apparatus, the selectivity of the etching rate between the PZT film and the resist 500 may be adjusted. Alternatively, the selectivity of the etching rate between the PZT film and the resist 500 may be adjusted by appropriately combining the above methods.

Figure 9:
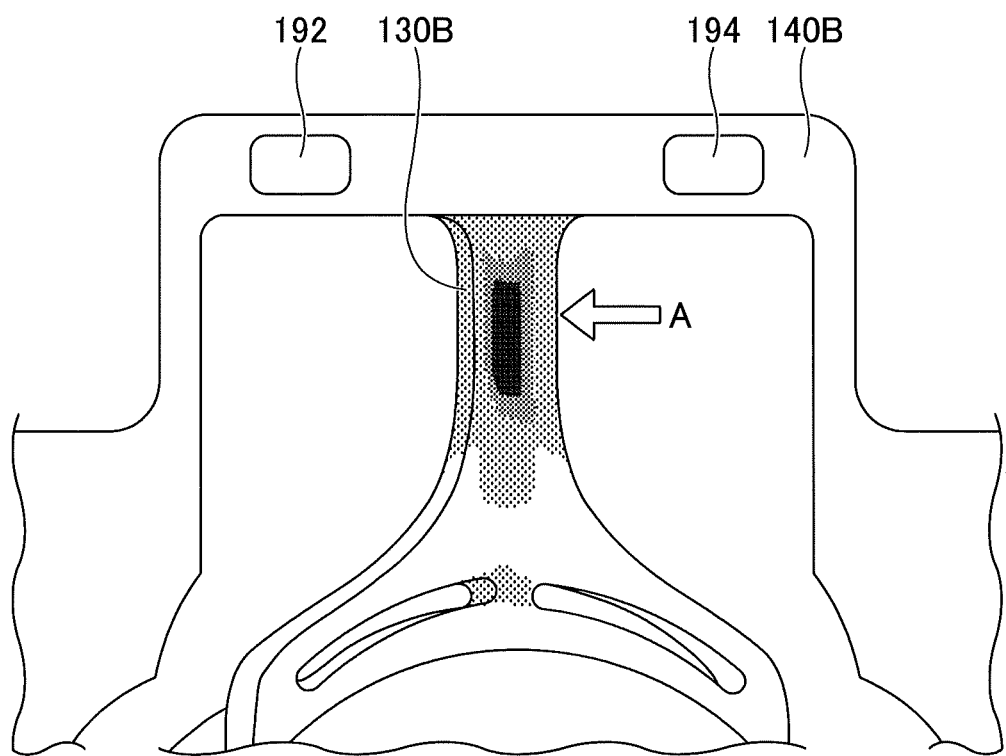
FIG. 9 illustrates an example of a simulation result of stress, generated when a mirror 110 is swung in the horizontal direction.

FIG. 9 illustrates an example of a simulation result of stress generated when the mirror 110 is swung in the horizontal direction. As illustrated in FIG. 9, upon swinging the mirror 110 in the horizontal direction, stress concentrates on the twist beam 130B. The same applies to the twist beam 130A, which is located on the opposite side of the twist beam 130B with respect to the mirror 110. Note that in FIG. 9, a dark-colored portion indicated by the arrow A is a portion where stress is concentrated.

In this way, when the mirror 110 swings in the horizontal direction, as the swing angle in the horizontal direction increases, the stress concentrates on the twist beams 130A and 130B. Therefore, if the swing angle in the horizontal direction is further increased, the twist beams 130A and 130B are supposed to be broken first.

However, the inventors have found that, there is a case in which, as the swing angle in the horizontal direction is increased, the vicinity of the piezoelectric sensor 192 of the connection beam 140B is broken before the twist beams 130A and 130B are broken.

The inventors have examined the cause and found that when the tilt angle of the tilted surface (side surface) of the piezoelectric thin film constituting the piezoelectric sensor is large, stress concentrates on the tilted surface of the piezoelectric thin film, and before the twist beams 130A and 130B break, the vicinity of the tilted plane of the piezoelectric thin film breaks. For example, when the piezoelectric sensor 192 has a structure that is illustrated in FIG. 7B and the tilt angles $\theta_1$ and $\theta_2$ are large, the vicinity of the piezoelectric sensor 192 is broken.

Figure 10A:
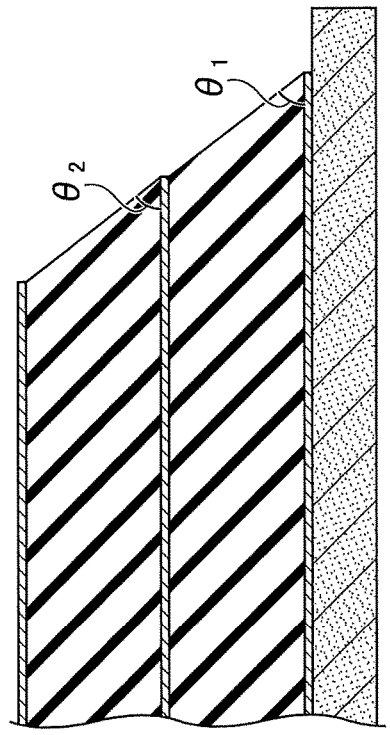
FIGS. 10A to 10D illustrate examples of a simulation result of the relationship between a tilt angle and stress.
Figure 10B:
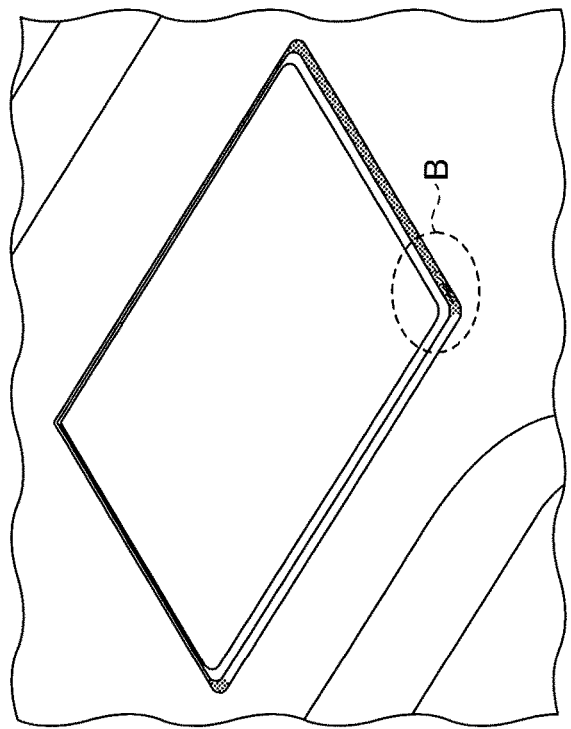
Figure 10C:
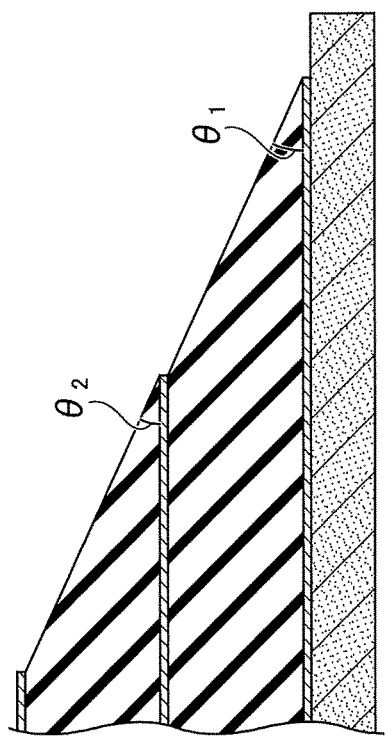
Figure 10D:
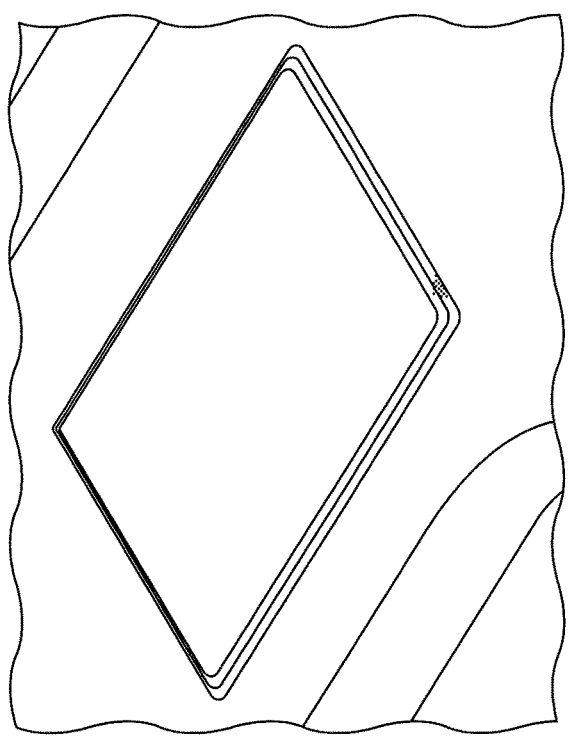

FIGS. 10A to 10D illustrate examples of a simulation result of the relationship between a tilt angle and stress. FIG. 10A and FIG. 10B illustrate an example in a case in which the tilt angle $\theta_1=\theta_2=60$ degrees in FIG. 7B. FIG. 10A indicates a cross section, and FIG. 10B indicates a simulation result. Also, FIG. 10C and FIG. 10D illustrate an example in a case in which the tilt angle $\theta_1=\theta_2=30$ degrees in FIG. 7B. FIG. 10A indicates a cross section, and FIG. 10B indicates a simulation result.

In the case where the tilt angle $\theta_1=\theta_2=60$ degrees, as illustrated in FIG. 10B, stress concentration occurs at an end portion of the tilted surface surrounded by the broken line B (the higher the density of the dots, the more concentrated the stress). On the other hand, in the case where the tilt angle $\theta_1=\theta_2=30$ degrees, stress concentration does not occur as illustrated in FIG. 10D. As described above, when the tilt angles $\theta_1$ and $\theta_2$ are large, stress concentrates in the vicinity of the piezoelectric sensor, which may lead to breakdown before the twist beam.

Next, a preferable value of the tilt angle of a piezoelectric thin film constituting a piezoelectric sensor will be discussed. A preferable value of the tilt angle of the tilted surface of the piezoelectric thin film depends on the distance from the horizontal rotational axis H to the piezoelectric sensor.

That is, as the distance from the horizontal rotational axis H to the piezoelectric sensor increases, stress generated when the mirror 110 swings in the horizontal direction becomes difficult to occur on the piezoelectric sensor, thus the tilt angle may be large. In other words, as the distance from the horizontal rotational axis H to the piezoelectric sensor decreases, stress at the time of swinging the mirror 110 in the horizontal direction becomes easier to concentrate on the piezoelectric sensor, thus it is required to make the tilt angle smaller and to relax the stress applied to the piezoelectric sensor.

Making the distance from the horizontal rotational axis H to the piezoelectric sensor long is not preferable because a phase difference occurs between the swing of the mirror 110 and the output of the piezoelectric sensor. Therefore, it is preferable to make the distance from the horizontal rotational axis H to the piezoelectric sensor short.

Therefore, a relationship between the distance from the horizontal rotational axis H to the piezoelectric sensor and a preferable tilt angle is obtained by simulation so as to realize a piezoelectric sensor having a preferable tilt angle in accordance with the distance from the horizontal rotational axis H to the piezoelectric sensor.

Figure 11:
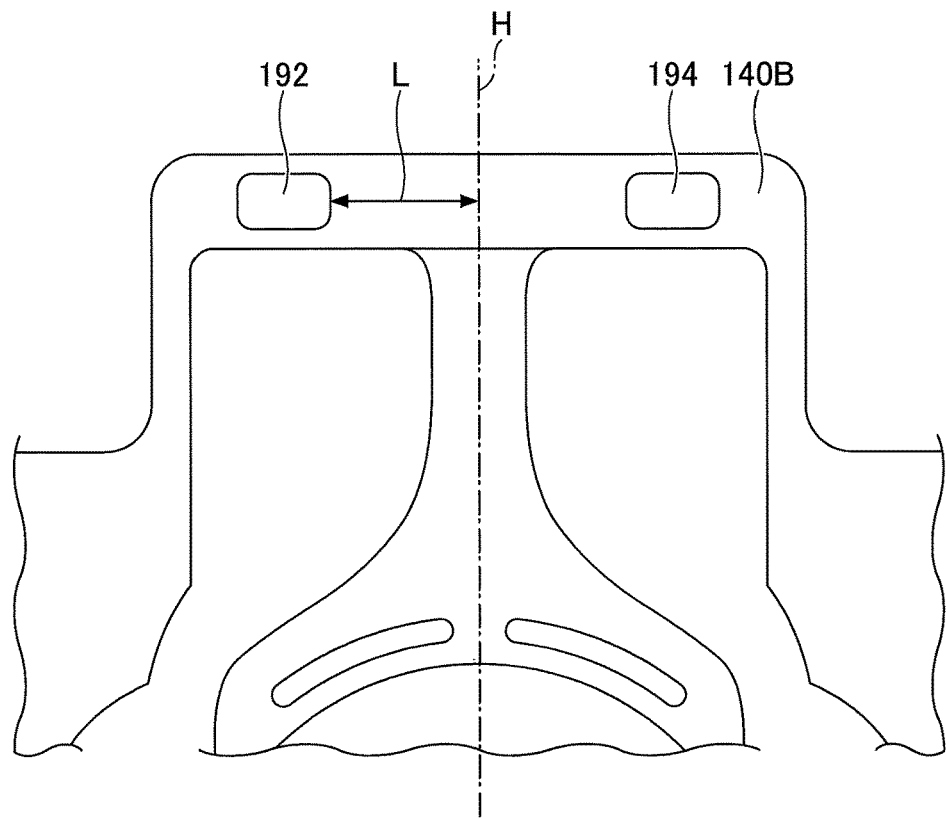
FIG. 11 is a diagram that describes details of a simulation for the relationship between a distance and stress.

FIG. 11 is a diagram that describes details of a simulation for the relationship between the distance and stress. A relationship between the distance L from the horizontal rotational axis H illustrated in FIG. 11 to the end portion of the piezoelectric sensor 192 and stress generated at the end portion of the piezoelectric sensor 192 is obtained by a simulation with the tilt angle $\theta$ of the piezoelectric thin film constituting the piezoelectric sensor 192 as a parameter.

Figure 12:
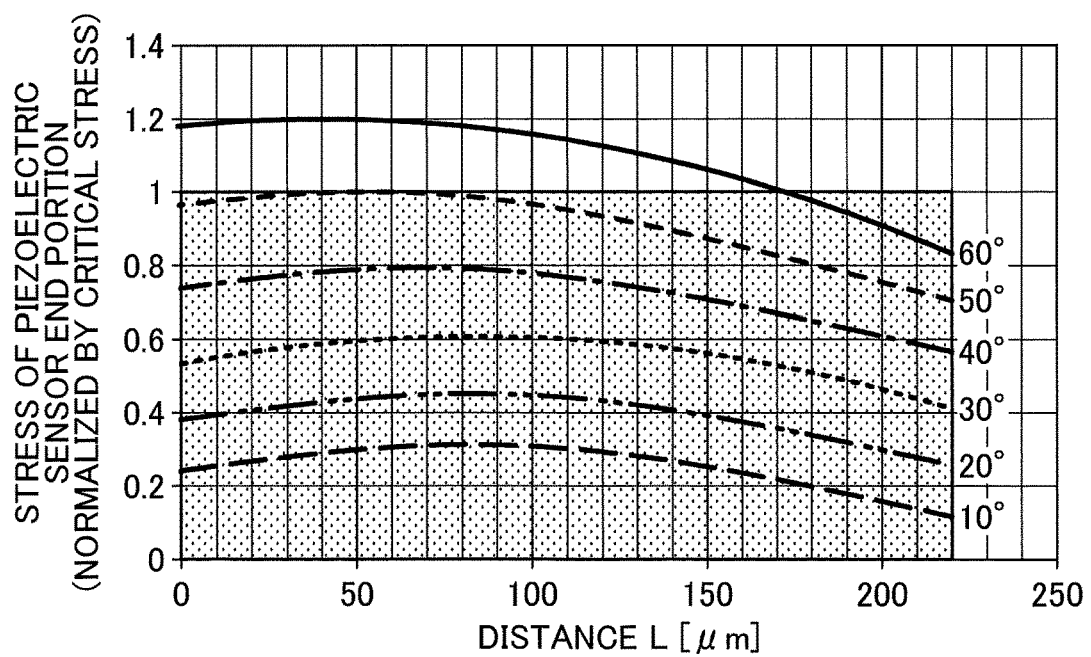
FIG. 12 is a diagram that describes a result of the simulation for the relationship between the distance and the stress (part 1)
Figure 13:
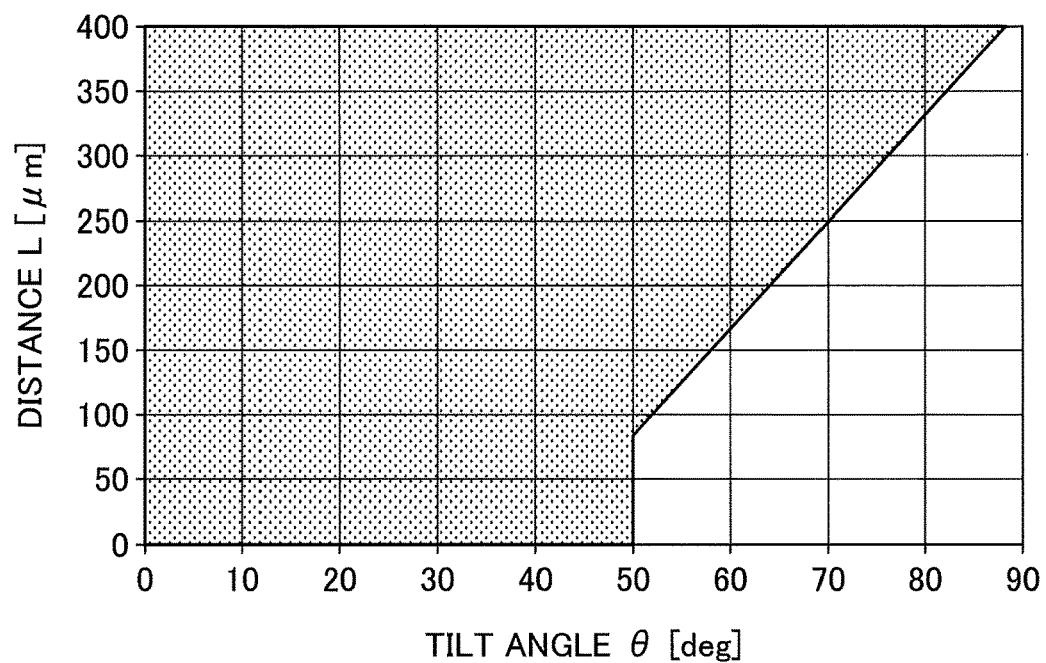
FIG. 13 is a diagram that describes the result of the simulation for the relationship between the distance and the stress (part 2)

FIG. 12 and FIG. 13 are diagrams that describe a result of the simulation for the relationship between the distance and the stress. Stress of the piezoelectric sensor end portion indicated by the vertical axis is normalized by critical stress at which a silicon substrate of the piezoelectric sensor end portion breaks. Also, the hatched portion in FIG. 12 indicates a range not exceeding the critical stress (that is, a range in which the silicon substrate of the piezoelectric sensor end portion does not break). Note that although FIG. 12 and FIG. 13 indicates normalization by the critical stress of the piezoelectric sensor end portion, a similar range is obtained in a case where a piezoelectric sensor portion other than the piezoelectric sensor end portion breaks or in a case where both a piezoelectric sensor portion and the silicon substrate break.

As illustrated in FIG. 12, at each of the tilt angles $\theta$, the stress of the piezoelectric sensor end portion reaches the maximum at a predetermined distance L, and thereafter, as the distance L increases, the stress of the piezoelectric sensor end portion decreases. Also, as the tilt angle $\theta$ decreases, stress of the end portion of the piezoelectric sensor decreases.

FIG. 13 illustrates the relationship between the tilt angle $\theta$ and the distance L based on the result in FIG. 12, and the hatched portion indicates a range not exceeding the critical stress. As illustrated in FIG. 12 and FIG. 13, when the tilt angle $\theta$ is $0°<\theta\leq50°$, the stress at the end portion of the piezoelectric sensor does not reach the critical stress regardless of the distance. In a case of $\theta>50$, as long as $L\geq8\theta-310$ is satisfied, the stress at the end portion of the piezoelectric sensor does not reach the critical stress. Note that in FIG. 13, the tilted portion on the lower end of the hatching at $\theta>50°$ is $L=8\theta-310$.

As described above, by making the tilt angle $\theta$ $0°<\theta\leq50°$, it is possible to prevent the silicon substrate of the piezoelectric sensor end portion from being broken irrespective of the distance L. Also, in a where the tilt angle $\theta>50°$, by making the distance L within the range satisfying $L\geq8\theta-310$, it is possible to prevent the silicon substrate of the piezoelectric sensor end portion from being broken.

Note that although the simulation result for the piezoelectric sensor 192 is described above, similar results can be obtained in a case where wires are formed on the piezoelectric thin films constituting the piezoelectric elements 191, 193, and 194 to be used as piezoelectric sensors.

Variation Example 1 of the First Embodiment

As variation example 1 of the first embodiment, an example having a changed planar shape of a piezoelectric thin film will be described. Note that in variation example 1 of the first embodiment, descriptions of constituent elements that are the same as those of the first embodiment previously described may be omitted as appropriate.

Figure 14A:
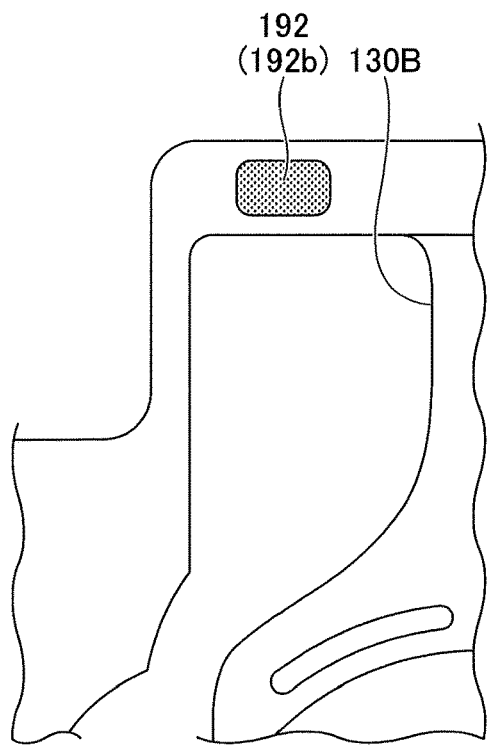
FIGS. 14A and 14B are diagrams that describe a shape change of a piezoelectric thin film.
Figure 14B:
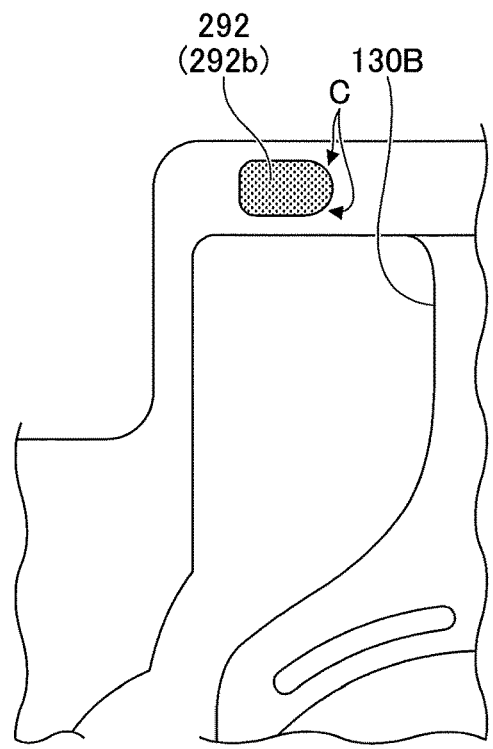

FIGS. 14A and 14B are diagrams that describe a shape change of a piezoelectric thin film. FIG. 14A is an enlarged view of the piezoelectric sensor 192 according to the first embodiment. Here, for convenience of description, FIG. 14A illustrates only the piezoelectric thin film 192b constituting the piezoelectric sensor 192. The planar shape of the piezoelectric thin film 192b is a substantially rectangular shape in which the four corners are formed in R shapes, and the R shapes (curvature radii) of the four corners are equal to each other.

FIG. 14B is an enlarged view of a piezoelectric sensor 292 according to variation example 1 of the first embodiment. Here, for convenience of description, FIG. 14B illustrates only a piezoelectric thin film 292b constituting the piezoelectric sensor 292. Similarly to the piezoelectric thin film 192b, the planar shape of the piezoelectric thin film 292b is a substantially rectangular shape in which the four corners are formed in R shapes. However, in the piezoelectric thin film 292b, the radii of curvature of the R shapes at the two corners farther from the twist beam 130B are the same as the radius of curvature of the corners of the piezoelectric thin film 192b, but the radii of curvature of the R shapes at the two corners closer to the twist beam 130B (portions C in FIG. 14B) are larger than the radius of curvature of the corners of the piezoelectric thin film 192b.

That is, in the piezoelectric thin film 292b, the radii of curvature of the R shapes at the two corners, where stress is not easily applied, farther from the twist beam 130B are the same as the radius of curvature of the corners of the piezoelectric thin film 192b, but the radii of curvature of the R shapes at the two corners, where stress is easily applied, closer to the twist beam 130B are larger than the radius of curvature of the corners of the piezoelectric thin film 192b.

In this manner, in the piezoelectric thin film 292b, by making the radii of curvature of the R shapes at the two corners closer to the twist beam 130B (closer to the horizontal rotational axis H), where stress is easily applied, larger than those of the other two corners (farther from the horizontal rotational axis H), stress applied to the piezoelectric thin film 292b can be further relaxed.

That is, in addition to the side surface of the piezoelectric thin film 292b satisfying the relationship between the tilt angle and the distance L described with reference to FIG. 12 and FIG. 13, in the piezoelectric thin film 292b, by making the radii of curvature of the R shapes at the two corners closer to the twist beam 130B, where stress is easily applied, larger than those of the other two corners, stress applied to the piezoelectric thin film 292b can be further relaxed.

Note that in a case where the piezoelectric sensor 292 has a stacking structure similar to that illustrated in FIG. 7B, the radii of curvature of the two corners closer to the twist beam 130B are preferably made larger than the radii of curvature of the other two corners, for all the piezoelectric thin films.

Here, in the piezoelectric thin film 292b, making the radii of curvature of all the four corners larger as compared with the piezoelectric thin film 192b is not preferable. This is because as the radii of curvature increase, the area of the piezoelectric thin film 292b decreases, and thus the impedance increases and it becomes weak against noise. Hence, in the piezoelectric thin film 292b, it is preferable to make only the radii of curvature of the two corners closer to the twist beam 130B, where stress is easily applied, greater than the radii of curvature of the other two corners and to secure the area as much as possible. This makes it possible to enhance the effect of relaxing the stress while suppressing an increase of the impedance as much as possible.

Although an example in which the piezoelectric thin film 192b constituting the piezoelectric sensor 192 is replaced with the piezoelectric thin film 292b having a different planar shape is described here, the same applies to a case in which wires are formed on the piezoelectric thin films constituting the piezoelectric elements 191, 193, and 194 to be used as piezoelectric sensors. That is, in the piezoelectric thin films constituting the piezoelectric elements 191, 193, and 194, by making the radii of curvature of the two corners closer to the twist beam 130A and the twist beam 130B, where stress is easily applied, larger than those of the other two corners, stress can be further relaxed.

Although a preferred embodiment has been described above, the present invention is not limited to the embodiment described above, and various variations and substitutions may be made for the embodiment described above without departing from the scope of the present invention.

What is claimed is:

1. An optical scanning device comprising:
  a pair of twist beams arranged on both sides of a mirror along a predetermined axis and configured to swing the mirror around the axis;
  a pair of connection beams connected to the respective twist beams;
  a piezoelectric sensor formed on the connection beams and configured to detect a displacement of the connection beams caused by a swing of the mirror around the axis;
  wherein the piezoelectric sensor includes
    a lower electrode;
    a piezoelectric thin film stacked on the lower electrode; and
    an upper electrode stacked on or above the piezoelectric thin film,
  wherein a bottom surface and a side surface of the piezoelectric thin film form a tilt angle θ, and
  wherein the tilt angle is greater than 0° and less than or equal to 50°,
  wherein a planar shape of the piezoelectric thin film is a substantially rectangular shape in which four corners are formed in rounded shapes, and
  wherein, among the four corners, radii of curvature of rounded shapes at two corners closer to the axis are larger than radii of curvature of rounded shapes at two corners farther from the axis.

2. The optical scanning device according to claim 1, wherein the piezoelectric sensor includes a plurality of piezoelectric thin films stacked between the lower electrode and the upper electrode, an intermediate electrode being interposed between the plurality of piezoelectric thin films, and
  wherein the tilt angle θ of each of the plurality of piezoelectric thin films is greater that 0° and less than or equal to 50°.

3. The optical scanning device according to claim 1, further comprising:
  a mirror support unit configured to support the mirror,
  wherein the twist beams support the mirror support unit from both sides of the axis, and
  wherein the connection beams have portions connected to end portions on opposite sides of the mirror support unit of the respective twist beams and extending in a direction perpendicular to the axis.

4. The optical scanning device according to claim 3, wherein on the portions extending in the direction perpendicular to the axis of the connection beams, the piezoelectric sensor is arranged one by one.

5. An optical scanning device comprising:
  a pair of twist beams arranged on both sides of a mirror along a predetermined axis and configured to swing the mirror around the axis;
  a pair of connection beams connected to the respective twist beams;
  a piezoelectric sensor formed on the connection beams and configured to detect a displacement of the connection beams caused by a swing of the mirror around the axis;
  wherein the piezoelectric sensor includes
    a lower electrode;
    a piezoelectric thin film stacked on the lower electrode; and
    an upper electrode stacked on or above the piezoelectric thin film,
  wherein a bottom surface and a side surface of the piezoelectric thin film form a tilt angle θ that is greater than or equal to 50°, and
  wherein a distance L in microns between the axis and the piezoelectric sensor and the tilt angle θ satisfy L≥8θ−310.

6. The optical scanning device according to claim 5,
wherein the piezoelectric sensor includes a plurality of piezoelectric thin films stacked between the lower electrode and the upper electrode, an intermediate electrode being interposed between the plurality of piezoelectric thin films, and
wherein the distance L in microns and the tilt angle $\theta$ of each of the plurality of piezoelectric thin films satisfy $L \geq 8\theta - 310$.

7. An optical scanning device comprising:
a pair of twist beams arranged on both sides of a mirror along a predetermined axis and configured to swing the mirror around the axis;
a pair of connection beams connected to the respective twist beams;
a piezoelectric sensor formed on the connection beams and configured to detect a displacement of the connection beams caused by a swing of the mirror around the axis;
wherein the piezoelectric sensor includes
a lower electrode;
an upper electrode; and
a first piezoelectric thin film and a second first piezoelectric thin film stacked between the lower electrode and the upper electrode,
wherein a bottom surface and a side surface of the first piezoelectric thin film form a first tilt angle $\theta 1$,
wherein a bottom surface and a side surface of the second piezoelectric thin film form a second tilt angle $\theta 2$ and
wherein the first tilt angle $\theta 1$ and the second tilt angle $\theta 2$ are both greater than 0° and less than or equal to 50°.

8. The optical scanning device according to claim 7, wherein the first tilt angle $\theta 1$ and the second tilt angle $\theta 2$ are equal to each other.

9. The optical scanning device according to claim 7, wherein, at a side facing the horizontal axis, the first piezoelectric thin film and the second piezoelectric thin film form the first tilt angle $\theta 1$ and second tilt angle $\theta 2$ that are both greater than 0° and less than or equal to 50°.

* * * * *